(12) United States Patent
Ng et al.

(10) Patent No.: US 7,692,483 B2
(45) Date of Patent: Apr. 6, 2010

(54) APPARATUS AND METHOD FOR PREVENTING SNAP BACK IN INTEGRATED CIRCUITS

(75) Inventors: Philip Ng, Cupertino, CA (US); Sai Kai Tsang, Union City, CA (US); Kris Li, Cupertino, CA (US); Liqi Wang, San Jose, CA (US); Jinshu Son, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 92 days.

(21) Appl. No.: 11/870,322

(22) Filed: Oct. 10, 2007

(65) Prior Publication Data

US 2009/0096501 A1  Apr. 16, 2009

(51) Int. Cl.
*H03H 3/356* (2006.01)
(52) U.S. Cl. ..................... 327/544; 327/208
(58) Field of Classification Search .......... 327/544–546
See application file for complete search history.

(56) References Cited

U.S. PATENT DOCUMENTS

| | | | |
|---|---|---|---|
| 4,487,639 A | 12/1984 | Lam et al. | |
| 4,551,743 A | 11/1985 | Murakami | |
| 4,683,637 A | 8/1987 | Varker et al. | |
| 4,769,687 A | 9/1988 | Nakazato et al. | |
| 4,992,843 A | 2/1991 | Blossfeld et al. | |
| 5,043,778 A | 8/1991 | Teng et al. | |
| 5,086,322 A | 2/1992 | Ishii et al. | |
| 5,258,642 A | 11/1993 | Nakamura | |
| 5,391,907 A | 2/1995 | Jang | |
| 5,436,183 A | 7/1995 | Davis et al. | |
| 5,473,500 A | 12/1995 | Payne et al. | |
| 5,565,375 A | 10/1996 | Hiser et al. | |
| 5,581,104 A | 12/1996 | Lowrey et al. | |
| 5,726,562 A * | 3/1998 | Mizuno ....................... 323/312 |
| 5,767,552 A | 6/1998 | Casper et al. | |
| 5,780,897 A | 7/1998 | Krakauer | |
| 5,814,865 A | 9/1998 | Duvvury et al. | |
| 5,834,793 A | 11/1998 | Shibata | |
| 5,847,429 A | 12/1998 | Lien et al. | |
| 5,852,375 A | 12/1998 | Byrne et al. | |
| 5,852,540 A | 12/1998 | Haider | |
| RE36,024 E | 1/1999 | Ho et al. | |

(Continued)

OTHER PUBLICATIONS

Anderson, Warren R., et al., "ESD protection for mixed-voltage I/O using NMOS transistors stacked in a cascode configuration", *IEEE Electrical Overstress/Electrostatic Discharge Symposium Proceedings*, 1998, (1998), 54-62.

(Continued)

*Primary Examiner*—Quan Tra
(74) *Attorney, Agent, or Firm*—Schwegman, Lundberg & Woessner, P.A.

(57) ABSTRACT

A method for preventing snap-back in a circuit including at least one MOS transistor having a parasitic bipolar transistor associated with it includes coupling a circuit node including at least one source/drain node of the at least one MOS transistor to a bias-voltage circuit and enabling the bias-voltage circuit to supply a potential to the at least one source/drain node of the at least on MOS transistor, the potential having a magnitude selected to prevent the parasitic bipolar transistor from turning on.

8 Claims, 1 Drawing Sheet

U.S. PATENT DOCUMENTS

| | | | |
|---|---|---|---|
| 5,877,046 A | 3/1999 | Yu et al. | |
| 5,880,917 A | 3/1999 | Casper et al. | |
| 5,930,094 A | 7/1999 | Amerasekera et al. | |
| 5,949,254 A | 9/1999 | Keeth | |
| 5,956,598 A | 9/1999 | Huang et al. | |
| 5,982,599 A | 11/1999 | Ma et al. | |
| 5,986,867 A | 11/1999 | Duvvury et al. | |
| 6,013,936 A | 1/2000 | Colt, Jr. | |
| 6,069,610 A | 5/2000 | Denda | |
| 6,091,594 A | 7/2000 | Williamson et al. | |
| 6,096,610 A | 8/2000 | Alavi et al. | |
| 6,104,589 A | 8/2000 | Williamson | |
| 6,118,323 A | 9/2000 | Chaine et al. | |
| 6,130,811 A | 10/2000 | Gans et al. | |
| 6,137,338 A | 10/2000 | Marum et al. | |
| 6,140,682 A | 10/2000 | Liu et al. | |
| 6,147,538 A | 11/2000 | Andresen et al. | |
| 6,181,540 B1 | 1/2001 | Schoenfeld et al. | |
| 6,194,764 B1 | 2/2001 | Gossner et al. | |
| 6,204,537 B1 | 3/2001 | Ma | |
| 6,246,094 B1 | 6/2001 | Wong et al. | |
| 6,271,566 B1 | 8/2001 | Tsuchiaki | |
| 6,285,213 B1 * | 9/2001 | Makino | 326/81 |
| 6,310,379 B1 | 10/2001 | Andresen et al. | |
| 6,331,469 B1 | 12/2001 | Park et al. | |
| 6,344,669 B1 | 2/2002 | Pan | |
| 6,346,729 B1 | 2/2002 | Liang et al. | |
| 6,399,973 B1 | 6/2002 | Roberds | |
| 6,465,852 B1 | 10/2002 | Ju | |
| 6,466,423 B1 | 10/2002 | Yu | |
| 6,515,344 B1 | 2/2003 | Wollesen | |
| 6,700,151 B2 | 3/2004 | Peng | |
| 6,713,993 B2 | 3/2004 | Descombes | |
| 6,809,386 B2 | 10/2004 | Chaine et al. | |
| 6,826,026 B2 | 11/2004 | Duvvury et al. | |
| 6,847,235 B2 * | 1/2005 | Graves | 327/106 |
| 6,958,518 B2 | 10/2005 | Wylie | |
| 7,215,188 B2 * | 5/2007 | Ramaraju et al. | 327/544 |
| 7,253,064 B2 | 8/2007 | Chaine et al. | |
| 2002/0142552 A1 | 10/2002 | Wu | |
| 2005/0275055 A1 | 12/2005 | Parthasarathy et al. | |
| 2008/0019064 A1 | 1/2008 | Chaine et al. | |

OTHER PUBLICATIONS

Wolf, S., *Silicon Processing for the VLSI Era*, vol. 2: *Process Integration*, Lattice Press, CA, (1990), 45-58.

* cited by examiner

APPARATUS AND METHOD FOR PREVENTING SNAP BACK IN INTEGRATED CIRCUITS

BACKGROUND

1. Field of the Invention

The present invention relates to integrated circuit technology.

2. The Prior Art

Snap back has been a problem in integrated circuits when voltage exceeding the junction breakdown of transistor devices is present in an integrated circuit. This problem is presently dealt with by providing guard ring structures as is known in the art. Guard ring structures only minimize but do not eliminate the snap back.

In circuits such as non-volatile memory, high voltage P-channel and N-channel MOS transistor devices are used to form latch circuits to store write data. The high voltage N-channel device is leaky, resulting in standby current flowing during standby. This also causes the latch circuit to flip states during high voltage operation, resulting in data corruption.

The flipping stage and data corruption in the high-voltage latch circuits are caused by snap back of the high-voltage N-channel or P-Channel device during high voltage operation. When the drain of the high-voltage N-channel device is at the breakdown voltage of the N-channel device, breakdown occurs causing a large current to flow into the substrate. The parasitic NPN bipolar device at the bottom of the high-voltage N-channel device can be triggered on by the large substrate current. As the parasitic NPN transistor turns on, a low-impedance path exists at the logic "1" node to ground, pulling down the voltage and causing the latch circuit to flip from a "1" state to a "0" state at the node. A similar situation can occur in PMOS structures, in which a parasitic PNP transistor can pull a low-voltage node to a high state.

BRIEF DESCRIPTION OF THE INVENTION

Apparatus and methods for preventing snap back in integrated circuits are disclosed. The common source connections of high-voltage latches are connected to a source node that is placed at a potential such that snap-back of the transistors in the high-voltage latches is prevented.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

Figure 1:
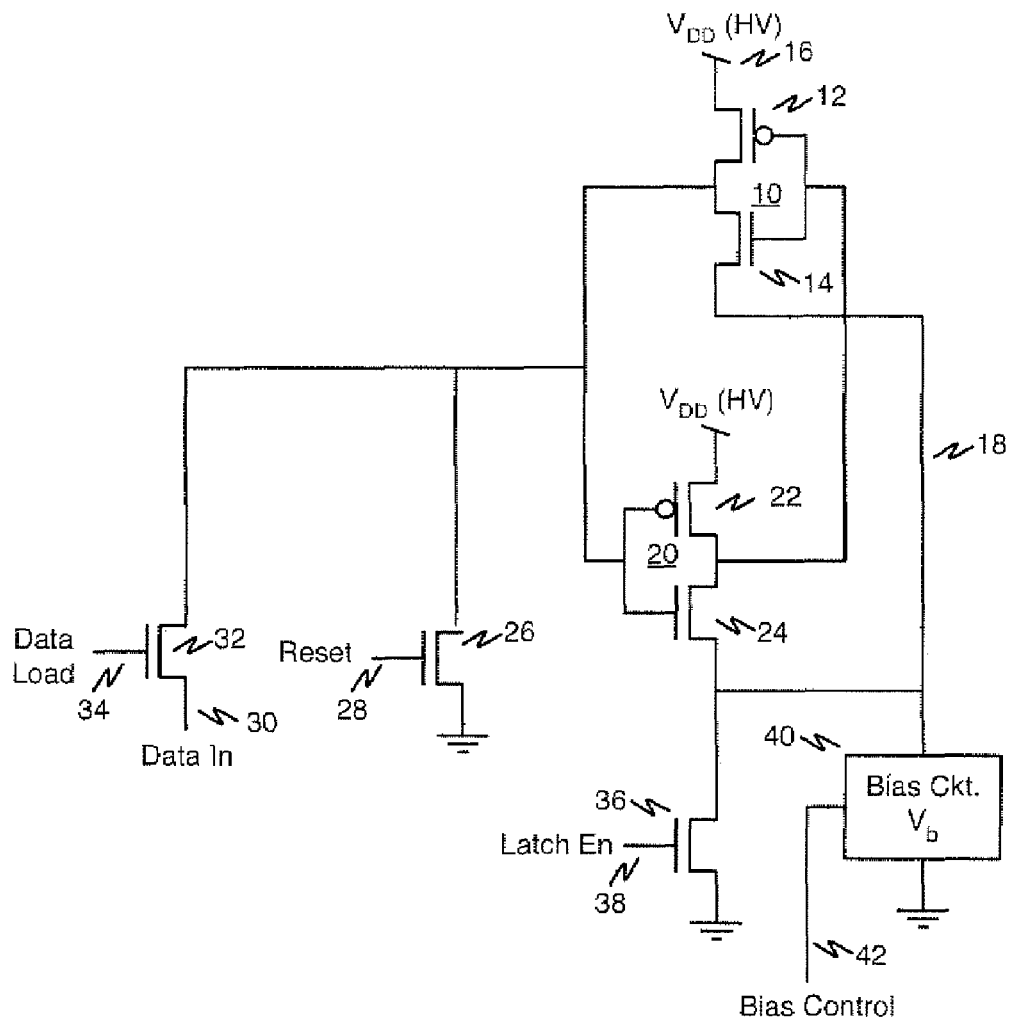
FIG. 1 is a schematic diagram of an exemplary apparatus for preventing snap back in integrated circuits in accordance with the present invention.

According to an illustrative example of an apparatus according to the present invention, as shown in FIG. 1, a first inverter 10 includes a P-channel MOS transistor 12 connected in series with an N-channel MOS transistor 14 between a high-voltage source $V_{HV}$ (shown at reference numeral 16), for example 16V, and a source node 18. The gates of transistors 12 and 14 are coupled together. A second inverter 20 includes a P-channel MOS transistor 22 connected in series with an N-channel MOS transistor 24 between the high-voltage source 16 and the source node 18. The gates of transistors 22 and 24 are coupled together. Transistors 12, 14, 22, and 24 are high-voltage transistors, that is, transistors designed to have breakdown voltages higher than the VDD voltage supplied to the integrated circuit. An illustrative example of such high voltage transistors are programming transistors in memory integrated circuits. The common drain node of transistors 12 and 14 is connected to the gates of transistors 22 and 24, and the common drain node of transistors 22 and 24 is connected to the gates of transistors 12 and 14.

The gates of transistors 22 and 24 are connected to the drain of an N-channel reset transistor 26. The source of N-channel reset transistor 26 is grounded and its gate is coupled to a Reset line 28. The gates of transistors 22 and 24 are also connected to a Data In line 30 through an N-channel data-load transistor 32. The gate of N-channel data-load transistor 32 is coupled to a Data Load line 34.

A high voltage N-channel latch-enable transistor 36 is connected between the common source connection of N-channel MOS transistors 14 and 22 of the write data latch circuits and ground. During standby, N-channel MOS latch-enable transistor 36 is turned off to eliminate the standby current. During write data loading, N-channel MOS latch-enable transistor 36 is turned on to enable latch operation. The gate of N-channel MOS latch-enable transistor 36 is coupled to a latch-enable line 38.

A bias circuit 40 generating a bias voltage $V_b$ is also connected to the common source connection of N-channel MOS transistors 14 and 24 of the write data latch circuits. During standby and write data loading, the bias circuit will be turned off using the bias control line 42. During high voltage operation, this bias circuit will be turned on, raising the ground node of the write data latch circuit to a bias voltage $V_b$ such that the $V_{DS}$ of the N-channel MOS transistors 14 and 24 is set to be below the snap-back voltage, and such that the $V_{DS}$ of the P-channel MOS transistors 12 and 22 is set to be bellow the snap-back voltage. The bias voltage $V_b$ must also be high enough so that $V_{DS}$ of N-channel MOS transistors 14 and 24 will be at a value where the circuit will still operate. In one example, the bias voltage $V_b$ is about 2V where $V_{HV}$ is 16V, $V_{DS}$ of N-channel MOS transistors 14 and 24 is 14V. Under these conditions there is no snap back because the snap back voltage would be 16V and the first and second inverters of FIG. 1 are still operating. The turn-on timing for the bias circuit is also important in that turning it on too early may cause the inverters to malfunction and turning it on too late may allow snap-back to occur prior to it being turned on.

Because the ground node (the common source connection of N-channel MOS transistors 14 and 22) of the write data latch circuit is at the voltage $V_b$, it is difficult for the parasitic NPN bipolar devices associated with those transistors to turn on and snap back will not take place. No logic-state flipping will occur and thus no data corruption will occur.

The high voltage generating circuit that generates $V_{HV}$ is configured to output a high voltage (such as 16V) during high voltage operation, will output $V_{DD}$ during write data loading, and will output ground during standby, thus eliminating current flow during standby. Persons of ordinary skill in the art will understand that configuring such a high-voltage circuit for a particular integrated circuit is a matter of routine circuit design.

Figure 2:
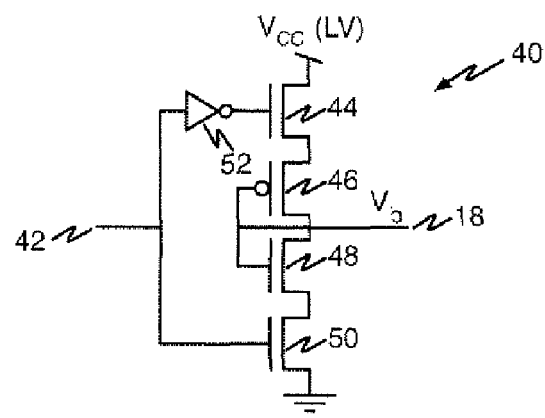
FIG. 2 is a schematic diagram showing an illustrative bias control circuit suitable for use in the present invention.

Referring now to FIG. 2, an exemplary bias circuit 40 is shown that may be employed to generate the bias voltage $V_b$ to apply to the common source node 18 comprising the connection of N-channel MOS transistors 14 and 24 of the write data latch circuits. Bias circuit 40 employs four transistors, including P-channel MOS transistor 44, P-channel MOS transistor 46, N-channel MOS transistor 48, and N-channel MOS transistor 50, connected in series between low-voltage supply $V_{CC}$ and ground. The gates of P-channel MOS transistor 46 and N-channel MOS transistor 48 are connected together to the common drain connections of P-channel MOS transistor 46 and N-channel MOS transistor 48, and to the output at the common source node 18. The gate of N-channel MOS transistor 50 is connected together to bias control signal line 42 and the gate of P-channel MOS transistor 44 is connected together to bias control signal line 42 through inverter 52.

When the voltage at bias control signal line 42 is low, N-channel MOS transistor 50 is turned off because its gate is at a low voltage. P-channel MOS transistor 44 is also turned off because its gate is at a high voltage through inverter 52. Under these conditions, source node 18 is floating. When the voltage at bias control signal line 42 is high, N-channel MOS transistor 50 is turned on because its gate is at a high voltage. P-channel MOS transistor 44 is also turned on because its gate is at a low voltage through inverter 52. Under these conditions, source node 18 is biased at a voltage such as about 2V through diode-connected transistors 46 and 48.

There are several advantages of the present invention over the use of guard rings. The present invention eliminates the snap back for both the P-channel and N-channel MOS transistors of the inverters while the use of guard rings only minimizes the snap back.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method including:
   coupling a circuit node including at least one source/drain node of at least one MOS transistor to a bias-voltage circuit; and
   enabling the bias-voltage circuit to supply a potential to the at least one source/drain node, the potential having a magnitude selected to prevent a parasitic bipolar transistor of the at least one MOS transistor from turning on, wherein the bias-voltage circuit includes:
   an enable input node;
   a bias-voltage output node;
   a first P-channel MOS transistor connected in series with a second P-channel MOS transistor between a first supply potential and the bias-voltage output node;
   a first N-channel MOS transistor connected in series with a second N-channel MOS transistor between a second supply potential and the bias-voltage output node;
   a gate of the first N-channel MOS transistor coupled to the enable input node and a gate of the first P-channel MOS transistor coupled to the input node through an inverter; and
   gates of the second N-channel MOS transistor and the second P-channel MOS transistor coupled to the bias-voltage output node.

2. The method of claim 1, wherein coupling the circuit node comprises coupling a source of at least one N-channel MOS transistor to the bias-voltage circuit.

3. The method of claim 1 wherein coupling the circuit node comprises coupling a source of a first N-channel MOS transistor of a first inverter to the bias-voltage circuit and coupling a source of a second N-channel MOS transistor of a second inverter to the bias-voltage circuit, the first and second inverters forming a high-voltage latch.

4. The method of claim 3 further including:
   selectively supplying a high voltage potential to the first and second inverters, and selectively enabling the bias-voltage circuit.

5. The method of claim 4 wherein the high-voltage latch and the bias-voltage circuit are enabled with a timing selected to allow functioning of the high-voltage latch and preventing an occurrence of a snap-back.

6. A circuit including:
   at least one MOS transistor having a parasitic bipolar transistor associated with it, the at least one MOS transistor having at least one source/drain node, the at least one MOS transistor comprising a first N-channel MOS transistor forming a part of a first inverter and a second N-channel MOS transistor forming a part of a second inverter, the first and second inverters forming a high-voltage latch; and
   a bias-voltage circuit configured to supply a potential to the at least one source/drain node of the at least one MOS transistor, the potential having a magnitude selected to prevent the parasitic bipolar transistor from turning on, wherein the bias-voltage circuit includes:
   an enable input node;
   a bias-voltage output node;
   a first P-channel MOS transistor connected in series with a second P-channel MOS transistor between a first supply potential and the bias-voltage output node;
   a first N-channel MOS transistor connected in series with a second N-channel MOS transistor between a second supply potential and the bias-voltage output node;
   a gate of the first N-channel MOS transistor coupled to the enable input node and a gate of the first P-channel MOS transistor coupled to the input node through an inverter; and
   gates of the second N-channel MOS transistor and the second P-channel MOS transistor coupled to the bias-voltage output node.

7. The circuit of claim 6 wherein the bias-voltage circuit is configured to be selectively enabled by providing an enable signal to the enable input node.

8. The circuit of claim 6, wherein the first inverter comprises a third P-channel MOS transistor coupled to the first N-channel MOS transistor, and the second inverter comprises a fourth P-channel MOS transistor coupled to the second N-channel MOS transistor.

* * * * *